(12) United States Patent
Igarashi

(10) Patent No.: US 10,923,270 B2
(45) Date of Patent: Feb. 16, 2021

(54) COMMON-MODE CHOKE COIL

(71) Applicant: Murata Manufacturing Co., Ltd., Kyoto-fu (JP)

(72) Inventor: Akio Igarashi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 340 days.

(21) Appl. No.: 15/898,113

(22) Filed: Feb. 15, 2018

(65) Prior Publication Data
US 2018/0261381 A1    Sep. 13, 2018

(30) Foreign Application Priority Data
Mar. 7, 2017    (JP) ................. 2017-042937

(51) Int. Cl.
*H01F 27/28*    (2006.01)
*H01F 27/32*    (2006.01)
(Continued)

(52) U.S. Cl.
CPC ........... *H01F 27/32* (2013.01); *H01F 17/045* (2013.01); *H01F 27/24* (2013.01);
(Continued)

(58) Field of Classification Search
CPC ...... H01F 27/29; H01F 27/2823; H01F 27/32; H01F 27/24; H01F 27/292; H01F 27/06; H01F 2027/065; H01F 17/045
(Continued)

(56) References Cited

U.S. PATENT DOCUMENTS 5,949,299 A    9/1999  Harada
2008/0003865 A1*  1/2008  Hatakeyama ......... H01F 17/045
                                                        439/399
(Continued)

FOREIGN PATENT DOCUMENTS

JP    S5025014 U    3/1975
JP    H10200360 A    7/1998
(Continued)

OTHER PUBLICATIONS

An Office Action; "Notification of Reasons for Refusal," Mailed by the Japanese Patent Office dated Jun. 18, 2019, which corresponds to Japanese Patent Application No. 2017-042937 and is related to U.S. Appl. No. 15/898,113 with English language translation.

*Primary Examiner* — Tszfung J Chan
(74) *Attorney, Agent, or Firm* — Studebaker & Brackett PC

(57) ABSTRACT

A common-mode choke coil comprises a ferrite core including a winding core portion and first and second flange portions. The common-mode choke coil also comprises first and second wires, each of which is helically wound around the winding core portion. The common-mode choke coil further comprises first and second terminal electrodes to which a first end of the first wire and a second end of the first wire, that is opposite the first end, are electrically connected, respectively. In addition, the common-mode choke coil comprises third and fourth terminal electrodes to which a first end of the second wire and a second end of the second wire, that is opposite the first end, are electrically connected, respectively. A common-mode inductance value at 150° C. and 100 kHz is 160 µH or more, and a return loss at 20° C. and 10 MHz is −27.1 dB or less.

20 Claims, 11 Drawing Sheets

(51) Int. Cl.
*H01F 27/38* (2006.01)
*H01F 17/04* (2006.01)
*H01F 27/24* (2006.01)
*H01F 27/29* (2006.01)
*H03H 1/00* (2006.01)
*H01F 17/00* (2006.01)

(52) U.S. Cl.
CPC ..... *H01F 27/2823* (2013.01); *H01F 27/2828* (2013.01); *H01F 27/292* (2013.01); *H01F 27/38* (2013.01); *H03H 1/00* (2013.01); *H01F 2017/0093* (2013.01); *H03H 2001/0021* (2013.01); *H03H 2001/0092* (2013.01)

(58) Field of Classification Search
USPC .................................................. 336/83, 192
See application file for complete search history.

(56) References Cited

U.S. PATENT DOCUMENTS

| | | | |
|---|---|---|---|
| 2011/0001595 A1* | 1/2011 | Kudo | H01F 27/263 336/192 |
| 2014/0167903 A1* | 6/2014 | Tomonari | H01F 27/2823 336/220 |
| 2015/0042434 A1* | 2/2015 | Bando | B65H 75/06 336/192 |
| 2016/0111204 A1 | 4/2016 | Hashimoto | |
| 2016/0187951 A1* | 6/2016 | Buckmeier | H04L 12/10 713/300 |
| 2016/0365191 A1* | 12/2016 | Horie | H01F 27/24 |
| 2017/0025212 A1* | 1/2017 | Jerez | H01F 41/0206 |
| 2019/0333675 A1* | 10/2019 | Fujita | H01F 27/2828 |

FOREIGN PATENT DOCUMENTS

| | | | | | |
|---|---|---|---|---|---|
| JP | 2004-247697 | A | | 9/2004 | |
| JP | 2005-213115 | A | | 8/2005 | |
| JP | 2009272315 | A | * | 11/2009 | ........... H01F 41/076 |
| JP | 2012-153556 | A | | 8/2012 | |
| JP | 2012153556 | A | * | 8/2012 | |
| JP | 2014-120730 | A | | 6/2014 | |
| JP | 2015-035473 | A | | 2/2015 | |
| JP | 2015222838 | A | * | 12/2015 | |
| JP | 2016-082091 | A | | 5/2016 | |
| JP | 2017-005079 | A | | 1/2017 | |

* cited by examiner

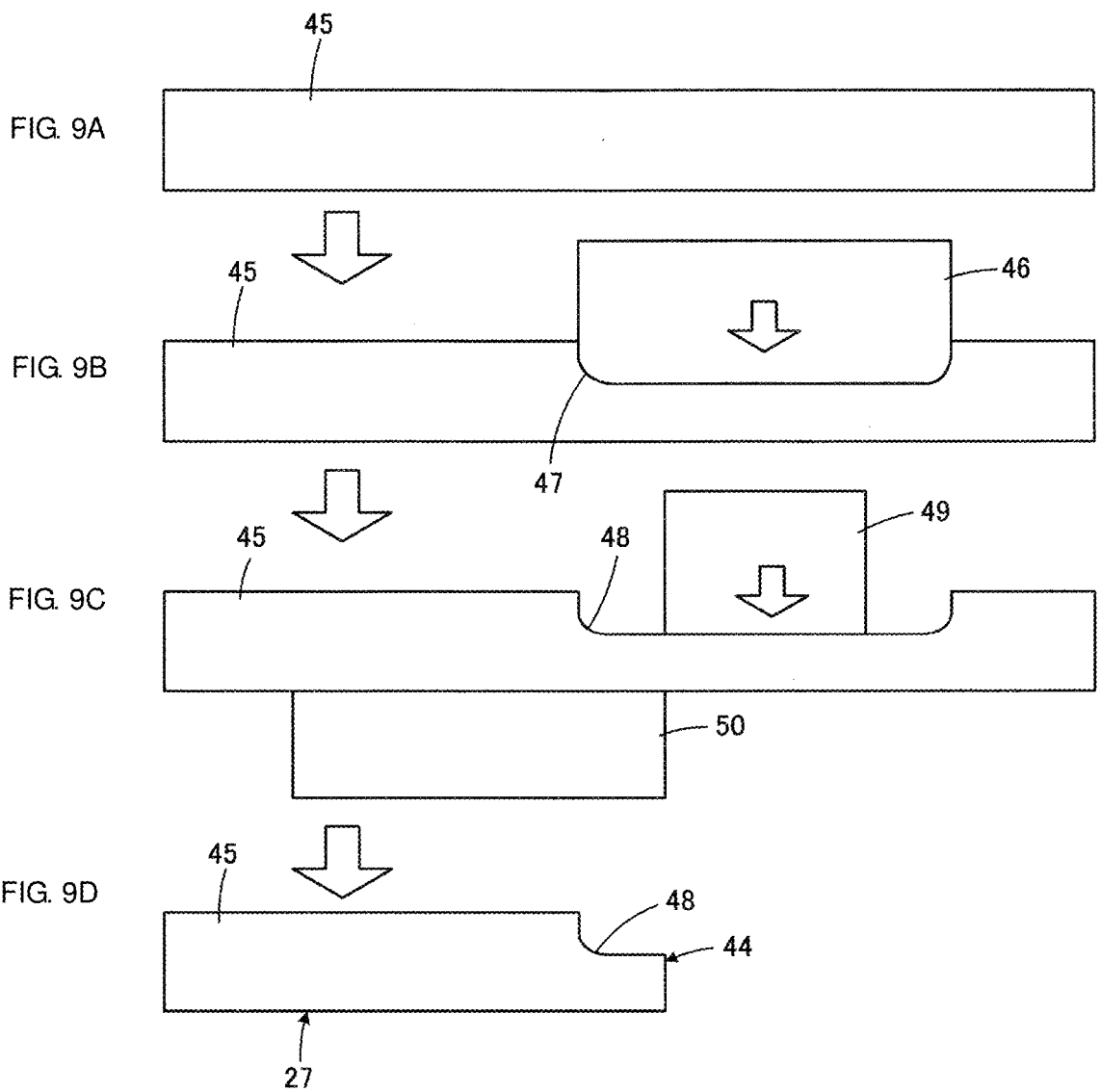

COMMON-MODE CHOKE COIL

CROSS-REFERENCE TO RELATED APPLICATION

This application claims benefit of priority to Japanese Patent Application No. 2017-042937, filed Mar. 7, 2017, the entire content of which is incorporated herein by reference.

BACKGROUND

Technical Field

This disclosure relates to a common-mode choke coil, and more particularly, to a common-mode choke coil including a ferrite core and a winding.

Background Art

Japanese Unexamined Patent Application Publication No. 2015-35473 discloses an example of a common-mode choke coil. The common-mode choke coil disclosed in Japanese Unexamined Patent Application Publication No. 2015-35473 includes a ferrite core and a winding and is particularly intended to be used in a vehicle.

Common-mode choke coils for use in vehicles are used to prevent a noise in digital communication between electronic devices from leaking and inhibit an extraneous noise from being transmitted. Examples of the standard of such digital communication include CAN and BroadR-Reach.

A feature of a common-mode choke coil used for CAN is good temperature characteristics, and, for example, a common-mode inductance value at 150° C. is 100 µH. Also, a feature of a common-mode choke coil used for BroadR-Reach is a high common-mode inductance value and, for example, a common-mode inductance value at 125° C. is 160 µH.

SUMMARY

The present disclosure provides a common-mode choke coil. According to one embodiment of the present disclosure, a common-mode choke coil comprises a ferrite core including a winding core portion and first and second flange portions that are respectively disposed on first and second end portions of the winding core portion that are opposite each other. The common-mode choke coil also comprises first and second wires, each of which is helically wound around the winding core portion and includes a linear central conductor and an insulating coating layer that covers a circumferential surface of the central conductor. The common-mode choke coil further comprises first and second terminal electrodes to which a first end of the first wire and a second end of the first wire that is opposite the first end are electrically connected, and third and fourth terminal electrodes to which a first end of the second wire and a second end of the second wire that is opposite the first end are electrically connected. In the common-mode choke coil, a common-mode inductance value at 150° C. and 100 kHz is 160 µH or more, and a return loss at 20° C. and 10 MHz is −27.1 dB or less.

With the above configuration, the common-mode choke coil enables at least high speed communication to be performed at a higher temperature and achieves high speed communication with higher quality at a normal temperature. The "return loss" in the description means Sdd11 in S (Scattering) parameters. In the following description, the "common-mode inductance value" is also referred to simply as the "inductance value".

In the common-mode choke coil, the return loss at 130° C. and 10 MHz is preferably −27 dB or less. With this configuration, the common-mode choke coil can achieve high speed communication in a wider temperature range without problems.

In the common-mode choke coil, a Curie temperature of the ferrite core is preferably 150° C. or more. With this configuration, the inductance value can be maintained at a predetermined value or more at between a low temperature and 150° C.

In the common-mode choke coil, a relative permeability of the ferrite core is preferably 1500 or less. With this configuration, the degree of freedom of design of the ferrite core is improved, and the ferrite core having, for example, a Curie temperature of 150° C. or more can be readily designed. Thus, the above configuration enables the common-mode choke coil to ensure the inductance value at a high temperature and to have good temperature characteristics.

In the common-mode choke coil, it is preferable that an external dimension of the ferrite core that is measured in an axial direction of the winding core portion be 3.4 mm or less, and an external dimension of the ferrite core that is measured in a direction perpendicular to the axial direction of the winding core portion be 2.7 mm or less. With this configuration, miniaturization of the common-mode choke coil enables the common-mode choke coil to be located nearer a low EMC component and improves a substantial effect of inhibiting a noise. In the case where the volume of the ferrite core is a predetermined volume or less, the absolute amount of expansion and shrinkage of the ferrite core due to heating and cooling can be decreased, and a variation in the characteristics at between a low temperature and a high temperature can be decreased.

In the common-mode choke coil, a thickness of each of the first and second flange portions that is measured in the axial direction of the winding core portion is more preferably less than 0.7 mm. With this configuration, the length of the winding core portion in the axial direction can be increased within the limited range of the external dimensions of the common-mode choke coil. This means that the degree of freedom of the way in which the wires are wound is increased. For this reason, the number of turns of the wires can be increased, and consequently, the inductance value can be increased, or the thickness of the wires to be wound can be increased. Therefore, disconnection of the wires is unlikely to occur, and the direct current resistance of the wires can be decreased. An increase in a clearance between the wires (thickness of the insulating coating) decreases a line capacitance.

The common-mode choke coil more preferably has the following configuration: an area of each of the first and second flange portions that is projected on a mounting surface is less than 1.75 mm$^2$ in a state where the common-mode choke coil is mounted on the mounting surface. With this configuration, the length of the winding core portion in the axial direction can be increased within the limited range of the external dimensions of the common-mode choke coil as in the more preferable embodiment described above, and accordingly, the same effects as in the more preferable embodiment described above can be expected.

In the common-mode choke coil, a sectional area of the winding core portion is more preferably less than 1.0 mm$^2$. With this configuration, the total length of the wires can be decreased while the number of turns of the wires is maintained, and accordingly, Sdd11 characteristics can be improved.

The common-mode choke coil more preferably has the following configuration: a distance between the winding core portion and a mounting surface is 0.5 mm or more in a state where the common-mode choke coil is mounted on the mounting surface. With this configuration, the distance between a ground pattern that can be formed on the mounting surface side and each of the wires wound around the winding core portion can be increased, a stray capacitance between the ground pattern and each of the wire wires can be decreased, and accordingly, mode conversion characteristics can be improved.

In the common-mode choke coil, the number of turns of each of the first and second wires wound around the winding core portion is preferably 42 turns or less. With this configuration, the total length of the wires can be decreased, and accordingly, the Sdd11 characteristics can be improved.

The common-mode choke coil preferably further includes a ferrite plate that extends over the first and second flange portions. The ferrite core and the ferrite plate form a closed magnetic circuit, and accordingly, the inductance value can be improved. In this case, a thickness of the ferrite plate is preferably 0.75 mm or less. With this configuration, the total height of the common-mode choke coil can be decreased, or the height position of the winding core portion can be a higher position away from the mounting surface without increasing the total height of the common-mode choke coil. Consequently, the stray capacitance between the ground pattern on the mounting surface side and each of the wires can be decreased, and accordingly, the mode conversion characteristics can be improved.

In the case where the ferrite plate is included as above, a clearance between the first and second flange portions and the ferrite plate is preferably 10 μm or less. With this configuration, the magnetic resistance of the magnetic circuit formed by the ferrite core and the ferrite plate can be decreased, and accordingly, the inductance value can be increased.

In the common-mode choke coil, a diameter of the central conductor of each wire is preferably 35 μm or less. With this configuration, since the diameter of the wires can be decreased, the number of turns of the wires wound around the winding core portion can be increased, miniaturization can be achieved without changing the number of turns of the wires, and the clearance between the wires can be increased without changing the wires and a coil shape. A decrease in the percentage of the wires in the coil shape enables dimensions of other components, such as the ferrite core, to be increased and further improves the characteristics.

In the common-mode choke coil, a diameter of the central conductor of each wire is preferably 28 μm or more. With this configuration, disconnection of the central conductor is unlikely to occur.

In the common-mode choke coil, a thickness of the insulating coating layer of each wire is preferably 6 μm or less. With this configuration, since the diameter of the wires can be decreased, the number of turns of the wires wound around the winding core portion can be increased, the miniaturization can be achieved without changing the number of turns of the wires, and the clearance between the wires can be increased without changing the wires and the coil shape. A decrease in the percentage of the wires in the coil shape enables dimensions of other components, such as the ferrite core, to be increased and further improves the characteristics.

In the common-mode choke coil, a thickness of the insulating coating layer of each wire is preferably 3 μm or more. With this configuration, the distance between the central conductors of the wires that are adjacent to each other in a winding state can be increased. Accordingly, the line capacitance is decreased, and the Sdd11 characteristics can be improved.

In the common-mode choke coil, the insulating coating layer of each wire is preferably formed of a resin containing at least an imide linkage. With this structure, the insulating coating layer can have heat resistance so as not to decompose at, for example, 150° C. Accordingly, the line capacitance does not vary even at a high temperature of 150° C., and the Sdd11 characteristics can be improved. An effect of the disclosure such as an effect of inhibiting a noise even at a high temperature of 150° C. can be enhanced.

According to some embodiments of the present disclosure, the common-mode choke coil enables at least high speed communication to be performed at a higher temperature, achieves high speed communication with higher quality at a normal temperature, and provides a solution that has not been assumed, which cannot be achieved by existing common-mode choke coils.

Other features, elements, characteristics and advantages of the present disclosure will become more apparent from the following detailed description with reference to the attached drawings.

BRIEF DESCRIPTION OF THE DRAWINGS

FIGS. 9A to 9D illustrate a process of obtaining the terminal electrode having the edge portion illustrated in FIG. 8A;

DETAILED DESCRIPTION

Figure 1A:
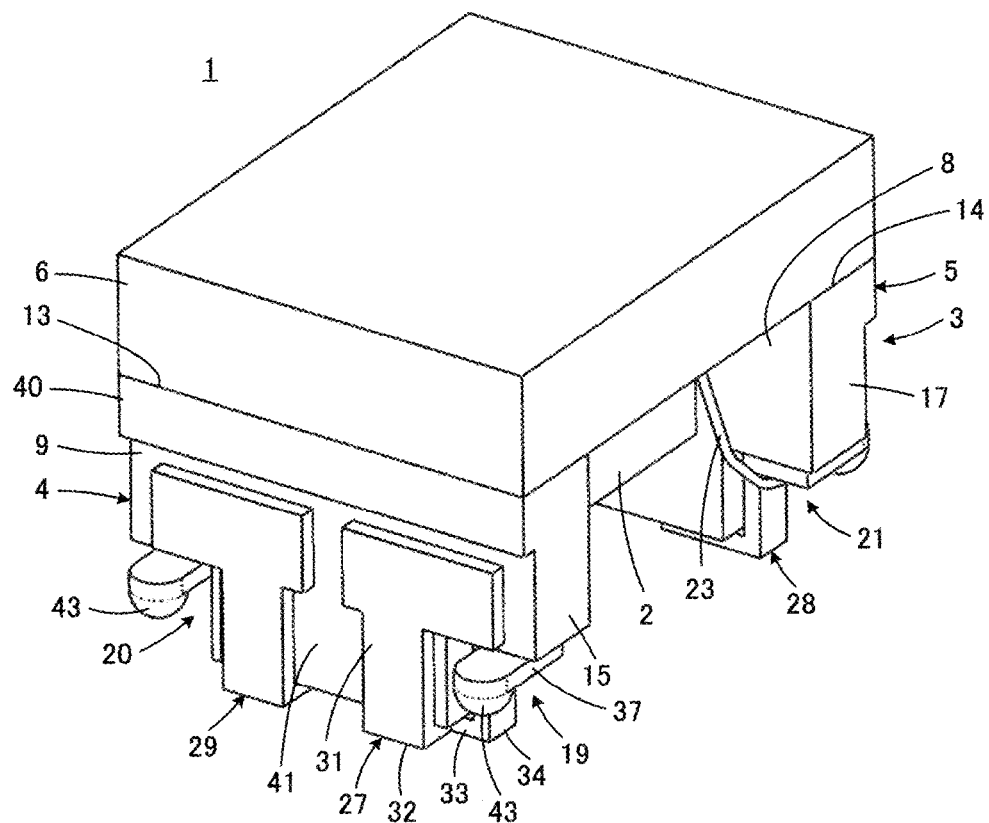
FIG. 1A is a perspective view of a common-mode choke coil according to an embodiment in the disclosure when viewed from a relatively upper position.

A common-mode choke coil 1 according to an embodiment in the disclosure will be described with reference to mainly FIGS. 1A and 1B, and FIGS. 2A to 2C.

The common-mode choke coil 1 includes a ferrite core 3 including a winding core portion 2. The ferrite core 3 has a drum shape and includes first and second flange portions 4 and 5 that are respectively disposed on first and second end portions of the winding core portion 2 that are opposite each other. The common-mode choke coil 1 also includes a ferrite plate 6 that extends over the first and second flange portions 4 and 5.

The Curie temperature of the ferrite core 3 is preferably 150° C. or more because an inductance value can be maintained at a predetermined value or more at between a low temperature and 150° C. The relative permeability of the ferrite core 3 is preferably 1500 or less. With this configuration, it is not necessary to use a special structure and material of the ferrite core 3 with high magnetic permeability. Accordingly, the degree of freedom of design of the ferrite core 3 is improved, and the ferrite core 3 having, for example, a Curie temperature of 150° C. or more can be readily designed. Thus, the above configuration enables the common-mode choke coil 1 to ensure the inductance value at a high temperature and to have good temperature characteristics.

The Curie temperature of the ferrite plate 6 is preferably 150° C. or more. The relative permeability of the ferrite plate 6 is preferably 1500 or less.

The flange portions 4 and 5 each have inner end surfaces 7 and 8 that face the winding core portion 2, and outer end surfaces 9 and 10 that are opposite the inner end surfaces 7 and 8 and that face outward, and end portions of the winding core portion 2 are disposed on the inner end surfaces 7 and 8. The flange portions 4 and 5 each have lower surfaces 11 and 12 that are to face a mounting substrate side (not illustrated) during mounting and upper surfaces 13 and 14 that are opposite the lower surfaces 11 and 12. The ferrite plate 6 is joined to the upper surfaces 13 and 14 of the flange portions 4 and 5. The first flange portion 4 has first and second side surfaces 15 and 16 that extend so as to connect the lower surface 11 and the upper surface 13 to each other and that oppose each other. The second flange portion 5 has first and second side surfaces 17 and 18 that extend so as to connect the lower surface 12 and the upper surface 14 to each other and that oppose each other.

Notch-like depressions 19 and 20 are formed on both end portions of the lower surface 11 of the first flange portion 4. Similarly, notch-like depressions 21 and 22 are formed on both end portions of the lower surface 12 of the second flange portion 5.

The common-mode choke coil 1 also includes first and second wires 23 and 24 that are helically wound around the winding core portion 2. In FIGS. 1A and 1B, and FIGS. 2A to 2C, end portions of the wires 23 and 24 are illustrated but portions of the wires 23 and 24 around the winding core portion 2 are omitted. As the wire 23 is illustrated in FIG. 3, the wires 23 and 24 each include a linear central conductor 25 and an insulating coating layer 26 that covers the circumferential surface of the central conductor 25.

The central conductor 25 is formed of, for example, a copper wire. The insulating coating layer 26 is preferably formed of a resin containing at least an imide linkage such as polyamide imide or imide-modified polyurethane. With this structure, the insulating coating layer can have heat resistance so as not to decompose at, for example, 150° C. Accordingly, a line capacitance does not vary even at a high temperature of 150° C., and Sdd11 characteristics can be improved. In addition, an effect of the disclosure such as an excellent effect of inhibiting a noise even at a high temperature of 150° C. can be enhanced.

The first and second wires 23 and 24 are wound in the same direction in parallel. The wires 23 and 24 may be wound so as to form two layers such that any one of the wires 23 and 24 is wound on an inner layer side and the other is wound on an outer layer side. The wires 23 and 24 may be wound in a bifilar winding manner such that the wires 23 and 24 are arranged so as to alternate in the axial direction of the winding core portion 2.

The diameter D of the central conductor 25 is preferably 35 μm or less. With this configuration, since the diameter of the wires 23 and 24 can be decreased, the number of turns of the wires 23 and 24 wound around the winding core portion 2 can be increased, the miniaturization can be achieved without changing the number of turns of the wires 23 and 24, and a clearance between the wires can be increased without changing the wires 23 and 24 and a coil shape. A decrease in the percentage of the wires 23 and 24 in the coil shape enables dimensions of other components, such as the ferrite core 3, to be increased and further improves the characteristics.

The diameter D of the central conductor 25 is preferably 28 μm or more. With this configuration, disconnection of the central conductor 25 is unlikely to occur.

The thickness T4 of the insulating coating layer 26 is preferably 6 μm or less. With this configuration, since the diameter of the wires 23 and 24 can be decreased, the number of turns of the wires 23 and 24 wound around the winding core portion 2 can be increased, the miniaturization can be achieved without changing the number of turns of the wires 23 and 24, and the clearance between the wires can be increased without changing the wires 23 and 24 and the coil shape. A decrease in the percentage of the wires 23 and 24 in the coil shape enables dimensions of other components, such as the ferrite core 3, to be increased and further improves the characteristics.

The thickness T4 of the insulating coating layer 26 is preferably 3 μm or more. With this configuration, the distance between the central conductors 25 of the wires 23 and 24 that are adjacent to each other in a winding state can be increased. Accordingly, the line capacitance is decreased, and the Sdd11 characteristics can be improved.

The common-mode choke coil 1 also includes first to fourth terminal electrodes 27 to 30. The first and third terminal electrodes 27 and 29 of the first to fourth terminal electrodes 27 to 30 are arranged in the direction in which the first and second side surfaces 15 and 16 oppose each other and are attached on the first flange portion 4 by using an adhesive. The second and fourth terminal electrodes 28 and 30 are arranged in the direction in which the first and second side surfaces 17 and 18 oppose each other and are attached on the second flange portion 5 by using an adhesive.

The first terminal electrode 27 and the fourth terminal electrode 30 have the same shape. The second terminal electrode 28 and the third terminal electrode 29 have the same shape. The first terminal electrode 27 and the third terminal electrode 29 are symmetric with each other with respect to a plane. The second terminal electrode 28 and the fourth terminal electrode 30 are symmetric with each other with respect to a plane. Accordingly, one terminal electrode of the first to fourth terminal electrodes 27 to 30, for example, the first terminal electrode 27 that is best illustrated in FIGS. 1A and 1B will be described in detail, and a detailed description of the second, third, and fourth terminal electrodes 28, 29, and 30 is omitted.

The terminal electrode 27 is typically manufactured in a manner in which a metallic plate formed of a copper alloy such as phosphor bronze or tough pitch copper is subjected to a progressive stamping process and a plating process. The terminal electrode 27 has a thickness of 0.15 mm or less, for example, a thickness of 0.1 mm.

Figure 1B:
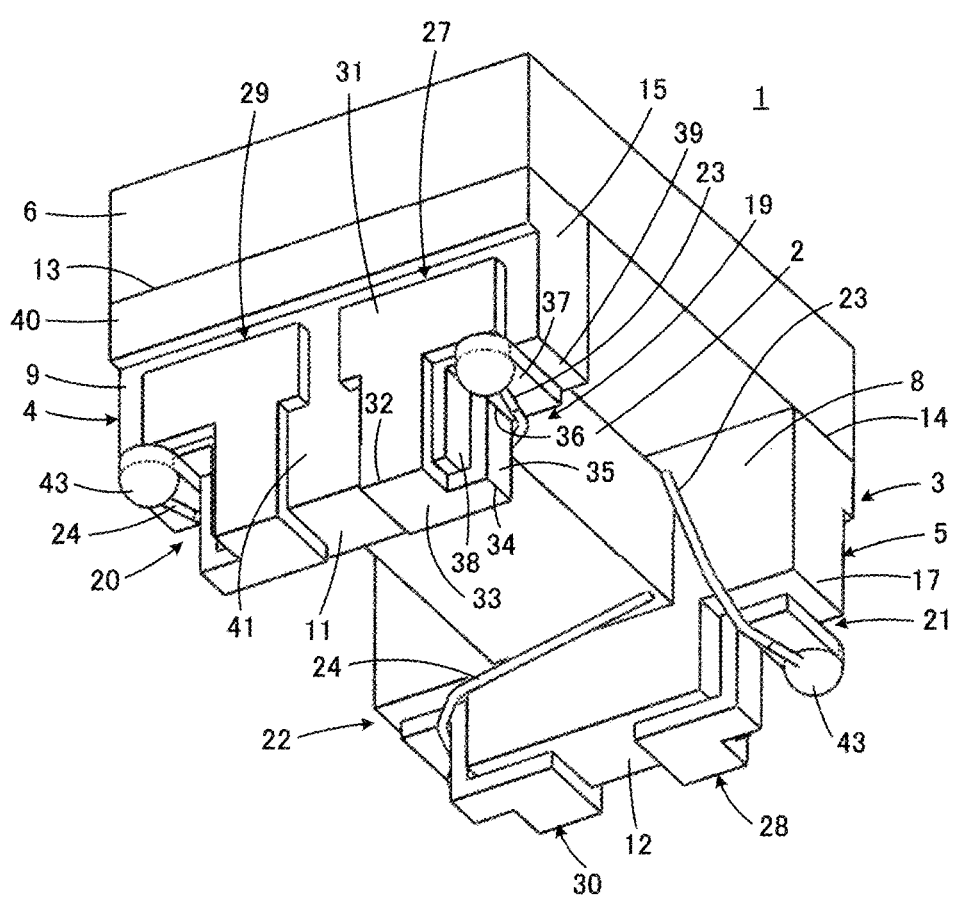
FIG. 1B is a perspective view of the common-mode choke coil when viewed from a relatively lower position.
Figure 2A:
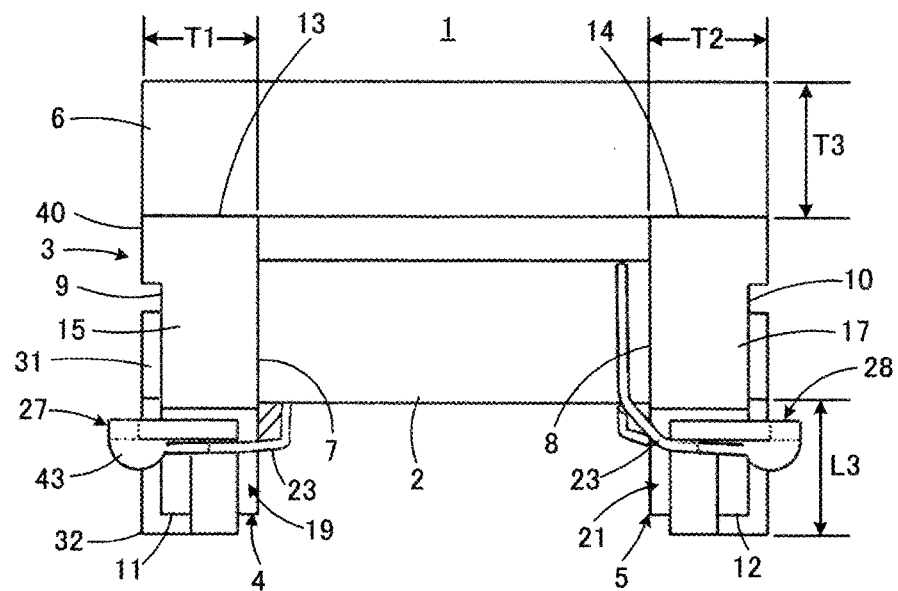
FIG. 2A is a front view of the common-mode choke coil illustrated in FIGS. 1A and 1B.

As well illustrated in FIG. 1B, the terminal electrode 27 includes a base 31 that extends along the outer end surface 9 of the flange portion 4, and a mounting portion 33 that extends from the base 31 along the lower surface 11 of the flange portion 4 across a first bent portion 32 that covers a ridge line along which the outer end surface 9 and the lower surface 11 of the flange portion 4 meet. When the common-mode choke coil 1 is mounted on the mounting substrate, not illustrated, the mounting portion 33 is to be electrically and mechanically connected to a conductive land on the mounting substrate by, for example, soldering.

Referring to FIG. 1B, the terminal electrode 27 also includes a rising portion 35 that extends from the mounting portion 33 across a second bent portion 34 and a receiving portion 37 that extends from the rising portion 35 across a third bent portion 36. The rising portion 35 extends along a vertical wall 38 that defines the depression 19. The receiving portion 37 extends along a bottom surface wall 39 that defines the depression 19. The receiving portion 37 is along an end portion of the wire 23 and is a portion at which the wire 23 is electrically and mechanically connected to the terminal electrode 27.

The receiving portion 37 is preferably located at a predetermined spacing from the flange portion 4. More specifically, it is preferable that the rising portion 35 and the receiving portion 37 be located at a predetermined spacing from the vertical wall 38 and the bottom surface wall 39 that define the depression 19 and be in contact with neither the vertical wall 38 nor the bottom surface wall 39.

The reference numbers 31, 32, 33, 34, 35, 36, and 37 that are used to denote the base, the first bent portion, the mounting portion, the second bent portion, the rising portion, the third bent portion, and the receiving portion of the first terminal electrode 27 are also used to denote the base, the first bent portion, the mounting portion, the second bent portion, the rising portion, the third bent portion, and the receiving portion of the second, third, and fourth terminal electrodes 28, 29, and 30 as needed.

A first end of the first wire 23 is electrically connected to the first terminal electrode 27. A second end of the first wire 23 opposite the first end is electrically connected to the second terminal electrode 28. A first end of the second wire 24 is electrically connected to the third terminal electrode 29. A second end of the second wire 24 opposite the first end is electrically connected to the fourth terminal electrode 30.

The wires 23 and 24 are typically wound around the winding core portion 2 before the wires 23 and 24 and the terminal electrodes 27 to 30 are connected to each other. During a winding process, the ferrite core 3 is rotated about the central axis of the winding core portion 2, and, in this state, the wires 23 and 24 are caused to traverse from a nozzle and supplied toward the winding core portion 2. Thus, the wires 23 and 24 are helically wound around the winding core portion 2.

During the winding process, since the ferrite core 3 is rotated as described above, the ferrite core 3 is held by a chuck connected to a rotary drive source. The chuck is configured to hold one of the flange portions of the ferrite core 3, for example, the first flange portion 4.

Attention is paid to the outer end surface 9 of the first flange portion 4. A projecting stepped portion 40 that extends along a ridge line along which the upper surface 13 and the outer end surface 9 meet is formed thereon. A flat surface 41 is formed in a region of the outer end surface 9 that is nearer than a region in which the stepped portion 40 is formed to the lower surface 11.

The terminal electrodes 27 to 30 are attached on the ferrite core 3. The base 31 of the terminal electrode 27 and the base 31 of the terminal electrode 29 are adjacent to each other in the direction in which the first and second side surfaces 15 and 16 oppose each other, and are along the flat surface 41 of the outer end surface 9. As illustrated in FIG. 2C, a clearance S1 between the base 31 of the terminal electrode 27 and the base 31 of the terminal electrode 29 on the side near the lower surface 11 is larger than a clearance S2 on the side near the upper surface 13 (or the stepped portion 40). According to the embodiment, the two bases 31 each have a T-shape, and accordingly, the clearances satisfying S1>S2 are achieved.

The gripping portion of the chuck holds the ferrite core 3 in a state where the gripping portion is in contact with five portions of the flange portion 4: (1) the first side surface 15, (2) the second side surface 16, (3) the upper surface 13, (4) the stepped portion 40, and (5) a portion of the flat surface 41 having the clearance S1. Accordingly, when the wires 23 and 24 are wound, the posture of the ferrite core 3 that is rotated can be stable.

The clearance S1 between the base 31 of the terminal electrode 27 and the base 31 of the terminal electrode 29 on the side near the lower surface 11 is preferably larger than 0.3 mm. This ensures a sufficient area of contact between the gripping portion of the chuck and the flat surface 41. The clearance S2 on the side near the upper surface 13 is preferably no less than 0.1 mm and no more than 0.3 mm (e.g., from 0.1 mm to 0.3 mm). In the case where the progressive stamping process is performed, it is typically difficult to perform punching with a dimension less than the thickness of the metallic plate as a workpiece. Accordingly, in the case where the thickness of the metallic plate, which is the material of each of the terminal electrodes 27 to 30, is 0.1 mm as described above, the progressive stamping process can be readily performed in a manner in which the clearance S2 is set to be no less than 0.1 mm and no more than 0.3 mm (e.g., from 0.1 mm to 0.3 mm).

When the ferrite core 3 held by the chuck connected to the rotary drive source is rotated about the central axis of the winding core portion 2 as described above, the wires 23 and 24 that are supplied from the nozzle traverse and are helically wound around the winding core portion 2. The number of turns of each of the first and second wires 23 and 24 wound around the winding core portion 2 is preferably 42 turns or less. The reason is that the total length of the wires 23 and 24 can be decreased, and the Sdd11 characteristics can be improved. The number of turns of each of the wires 23 and 24 is preferably 39 turns or more to ensure the inductance value.

The chuck is configured to hold only one of the flange portions, for example, the first flange portion 4 during the winding process, the other flange portion, for example, the second flange portion 5 may not include the stepped portion 40 and the flat surface 41, which the first flange portion 4 includes. The shape and arrangement of the base 31 of each of the second and fourth terminal electrodes 28 and 30 may not be the same as the base 31 of each of the first and third terminal electrodes 27 and 29, which is described above.

However, in the case where the first and second flange portions 4 and 5 and the first to fourth terminal electrodes 27 to 30 have the above characteristic structures, during the winding process, the directionality of the ferrite core 3 can be eliminated, and a directional error when the chuck holds the ferrite core 3 can be eliminated.

After the winding process, the wires 23 and 24 and the terminal electrodes 27 to 30 are connected to each other in the following manner.

Figure 4A:
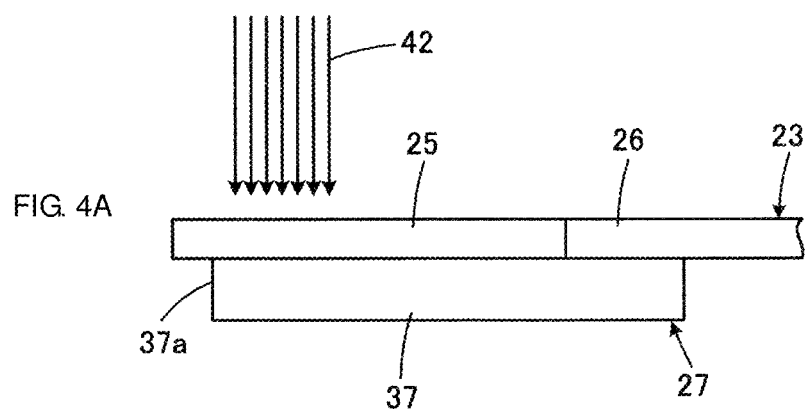
FIGS. 4A and 4B illustrate a process of electrically connecting the wire to a terminal electrode in the common-mode choke coil illustrated in FIGS. 1A and 1B.
Figure 4B:
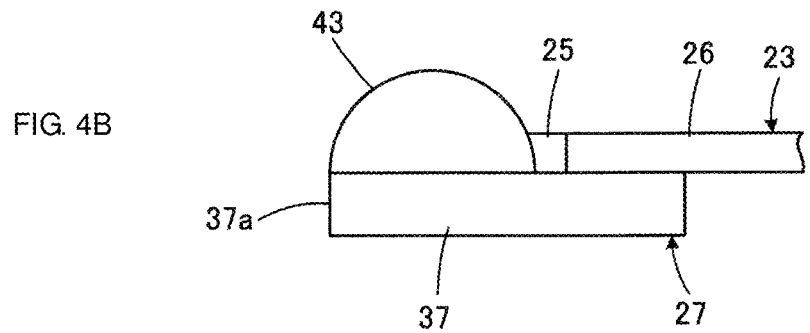

A process of connecting the first wire 23 to the first terminal electrode 27 will now be representatively described with reference to FIGS. 4A and 4B. FIGS. 4A and 4B schematically illustrate the receiving portion 37 of the first terminal electrode 27 and the end portion of the first wire 23.

Right after the winding process is finished, as illustrated in FIG. 4A, the end portion of the wire 23 is pulled so as to extend along the receiving portion 37 and reach a location on an end portion 37a of the receiving portion 37. The insulating coating layer 26 is removed from the entire circumference of the end portion of the wire 23. The insulating coating layer 26 is removed by using, for example, laser beam radiation.

Subsequently, as illustrated in FIG. 4A, a laser beam 42 for welding is directed toward a region in which the central conductor 25 exposed from the insulating coating layer 26 of the wire 23 overlaps the end portion 37a. Thus, the central conductor 25 and the end portion 37a on which the central conductor 25 is disposed are melted. At this time, as illustrated in FIG. 4B, the central conductor 25 and the end portion 37a that are melted are formed into a ball shape due to surface tension acting thereon, and a weld nugget portion 43 is formed. That is, the weld nugget portion 43 is integrally formed of the central conductor 25 and the terminal electrode 27 (end portion 37a). The central conductor 25 is contained in the weld nugget portion 43.

It is preferable that the receiving portion 37 be located at a predetermined spacing from the flange portion 4 and be not in contact with the flange portion 4 as described above. With this structure, increased heat during the welding process is unlikely to be transferred from the receiving portion 37 to the flange portion 4, and an adverse effect on the ferrite core 3 due to heat can be reduced, although this structure is not essential.

Figure 5:
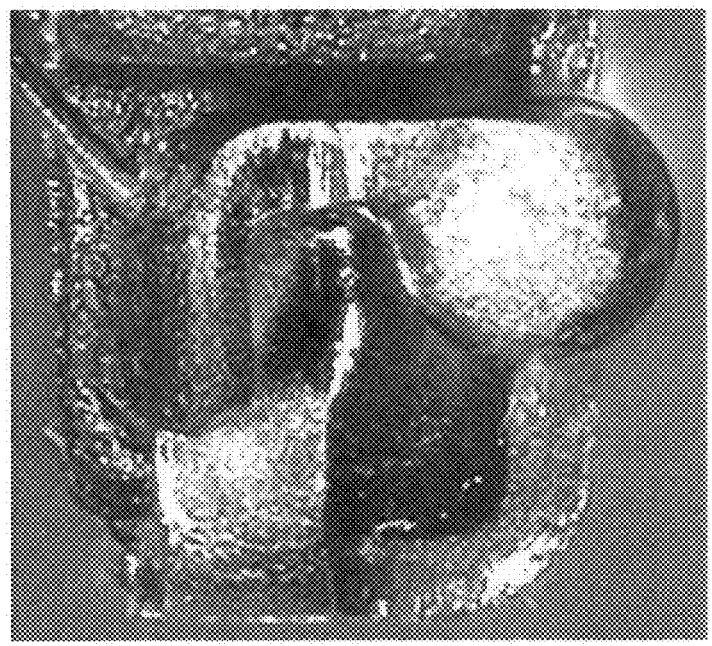
FIG. 5 illustrates a picture of an electrical contact between the wire and the terminal electrode of an actual product of the common-mode choke coil that is taken from the front direction.
Figure 6:
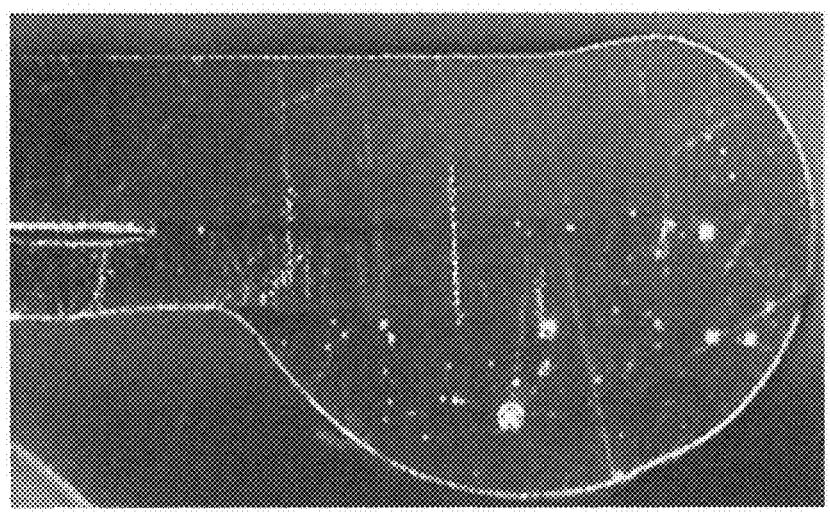
FIG. 6 illustrates a picture of an enlarged section of the electrical contact between the wire and the terminal electrode illustrated in FIG. 5.
Figure 7:
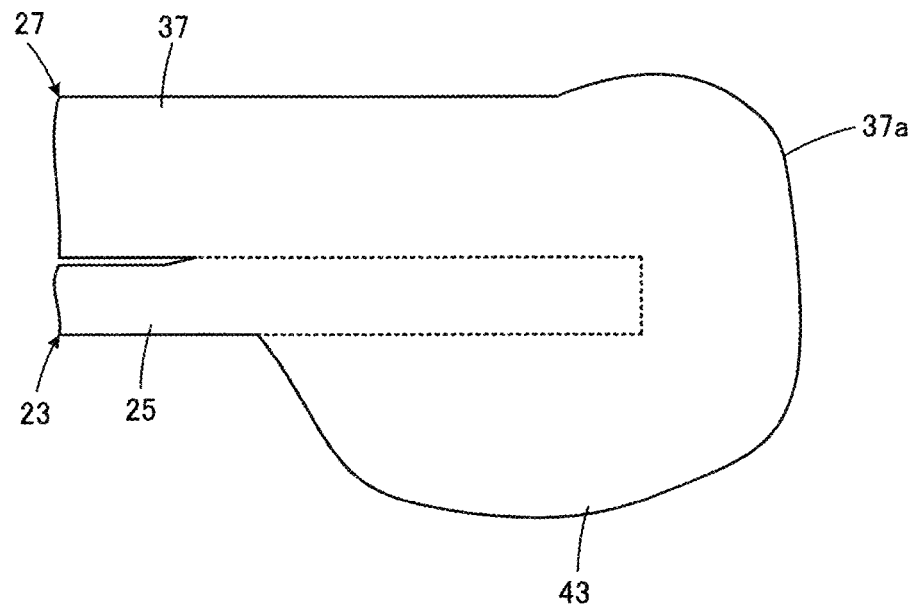
FIG. 7 is a diagram that is drawn by tracing the picture illustrated in FIG. 6 and that is used to describe the picture in FIG. 6.

FIG. 5 illustrates a picture of an electrical contact between one of the wires and one of the terminal electrodes of an actual product of the common-mode choke coil that is taken from the front direction. In FIG. 5, a circular portion at the upper right corresponds to a melt ball, that is, the weld nugget portion 43. FIG. 6 illustrates a picture of an enlarged section of the electrical contact between the wire and the terminal electrode illustrated in FIG. 5. FIG. 7 is a diagram that is drawn by tracing the picture illustrated in FIG. 6 and that is used to describe the picture in FIG. 6. In FIGS. 4A and 4B, the laser beam 42 is directed from above to below. This relationship in the vertical direction is opposite to that in FIGS. 5 to 7.

Comparing FIGS. 6 and 7, the weld nugget portion 43 is welded to and in contact with not only the end portion 37a but also a part of the receiving portion 37, which remains after welding, during the welding process. The central conductor 25 of the wire 23 is located between the receiving portion 37 and the weld nugget portion 43 and contained in the weld nugget portion 43. It is preferable that the insulating coating layer 26 be removed from the entire circumference of the end portion of the wire 23 and the central conductor 25 of the wire 23 at the end portion of the wire 23 be welded to the receiving portion 37 and the weld nugget portion 43. The weld nugget portion 43 preferably does not contain a substance originated from the insulating coating layer 26. The receiving portion 37 and the weld nugget portion 43 can be distinguished in a manner in which a portion whose outer edge shape is still a plate shape is regarded as the receiving portion 37 and a portion whose outer edge shape is a curved shape is regarded as the weld nugget portion 43.

In this way, strong welds can be obtained. The central conductor 25 of the wire 23 is located between the receiving portion 37 and the weld nugget portion 43, and the entire circumference thereof is contained in the weld nugget portion 43. Accordingly, a higher mechanical strength, a lower electric resistance, a higher stress resistance, and a higher chemical corrosion resistance, for example, can be achieved, and higher reliability of the weld structure can be achieved. Since the weld nugget portion 43 does not contain a substance originated from the insulating coating layer 26, blowholes during welding can be reduced. Also in this respect, high reliability of the weld structure can be achieved.

The other terminal electrodes 28 to 30 and the wire 23 or 24 are connected in the same manner as in connection between the first terminal electrode 27 and the first wire 23 that is described above.

After the wires 23 and 24 are wound, and the wires 23 and 24 are joined to the terminal electrodes 27 to 30, the ferrite plate 6 is joined to the upper surfaces 13 and 14 of the first and second flange portions 4 and 5 by using an adhesive. In this way, the ferrite core 3 and the ferrite plate 6 form a closed magnetic circuit, and accordingly, the inductance value can be improved.

The ferrite plate 6 may be replaced with a magnetic resin plate or a metallic plate that can form the magnetic circuit. The ferrite plate 6 may be omitted from the common-mode choke coil 1.

In the case where a stress due to, for example, thermal expansion and shrinkage is applied to the common-mode choke coil 1 completed in the above manner, or in the case where the wires 23 and 24 are pulled while the common-mode choke coil 1 is being manufactured, there is a possibility that the insulating coating layer 26 is damaged or the central conductor 25 is disconnected at a point at which at least one of the wires 23 and 24 is in contact with at least one of the terminal electrodes 27 to 30. In particular, when the common-mode choke coil 1 is used in a vehicle, a stress due to, for example, thermal expansion and shrinkage is likely to be applied to the common-mode choke coil 1. The contact point can be found, for example, from a place C surrounded by a circle in FIG. 2B.

These circumstances related to the first wire 23 and the first terminal electrode 27 illustrated in FIGS. 8A and 8B will be described in behalf of the wires 23 and 24 and the terminal electrodes 27 to 30.

The terminal electrode 27 is manufactured in a manner in which a metallic plate formed of a copper alloy such as phosphor bronze or tough pitch copper is subjected to the progressive stamping process and the plating process as described above. The terminal electrode 27 has a thickness of 0.15 mm or less, for example, a thickness of 0.1 mm. In this case, a sharp "droop" or "burr" is likely to be formed on an edge portion 44 of the terminal electrode 27 after press working as a result of shearing with a press. Accordingly, as illustrated in FIG. 8B, when the wire 23 comes into contact with the edge portion 44 on which the sharp "droop" or "burr" is formed, the insulating coating layer 26 is damaged, or the central conductor 25 is disconnected, as described above, in some cases.

Figure 8A:
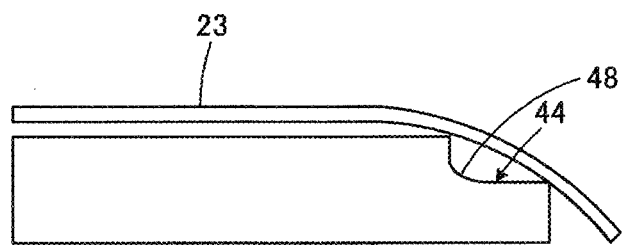
FIG. 8A schematically illustrates an edge portion of the terminal electrode and the wire pulled near the edge portion in the case of the common-mode choke coil illustrated in FIGS. 1A and 1B according to the embodiment in the disclosure.
Figure 8B:
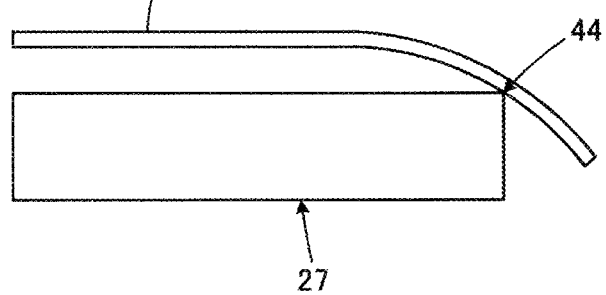
FIG. 8B schematically illustrates an edge portion of a terminal electrode and a wire pulled near the edge portion in the case of an example of an existing common-mode choke coil.

In view of this, according to the embodiment, as illustrated in FIG. 8A, the edge portion 44 is chamfered. In the case where the edge portion 44 is chamfered, the contact area increases, there are multiple contact points, and even when the wire 23 is in contact with the terminal electrode 27, a load applied from the terminal electrode 27 to the wire 23 is distributed. Accordingly, damage to the insulating coating layer 26 and disconnection of the central conductor 25 are unlikely to occur. Consequently, the central conductor 25 can continue to be appropriately covered by the insulating coating layer 26 at a location of contact between the edge portion 44 and the wire 23 so as not to be exposed from the insulating coating layer 26.

The terminal electrode 27 including the edge portion 44 that is chamfered as above is preferably obtained in a manner in which a coining process is added in processes included in the press working.

The detail will be described with reference to FIGS. 9A to 9D. As illustrated in FIG. 9A, a metallic plate 45, which is the material of the terminal electrode 27, is first prepared. Subsequently, as illustrated in FIG. 9B, a coining mold 46 is press-fitted into the metallic plate 45, and a mold pattern is formed on a main surface of the metallic plate 45. In the case where the coining mold 46 has a convex rounded surface 47, a mold pattern having a corresponding concave rounded surface 48 is formed on the metallic plate 45. Subsequently, as illustrated in FIG. 9C, a blanking process based on shearing is performed on the metallic plate 45 by using a punch 49 and a die 50. The metallic plate 45 is cut at a location inside a region of press-fitting by the coining mold 46, and the terminal electrode 27 is obtained.

The chamfered portion at which the concave rounded surface 48 corresponding to the convex rounded surface 47 is formed with the coining mold 46 remains on the edge portion 44 of the obtained terminal electrode 27. The edge portion 44 having the concave rounded surface 48 comes into contact with the wire 23 at two points. The reason is that a region of the edge portion 44 that is interposed between the two points of contact with the wire 23 has the recessed surface.

Figure 10:
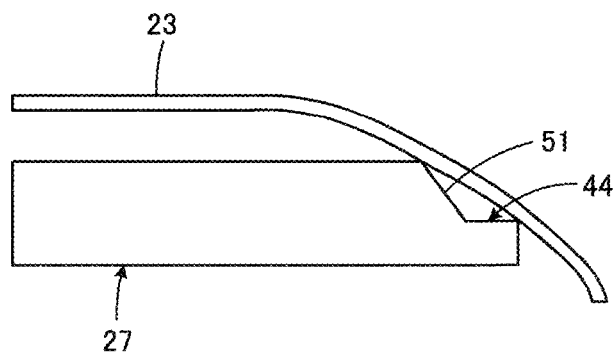
FIG. 10 illustrates a modification to the edge portion of the terminal electrode and corresponds to FIG. 8A.

The edge portion 44 of the terminal electrode 27 illustrated in FIG. 8A is chamfered to form the concave rounded surface 48. However, as illustrated in, for example, FIG. 10, the edge portion 44 may be chamfered to form a recessed surface 51 having a V-shape in section as a modification. In this case, the region of the edge portion 44 that is interposed between the two points of contact with the wire 23 has the recessed surface. The edge portion 44 comes into contact with the wire 23 at two points, and damage to the wire 23 can be decreased.

Figure 11:
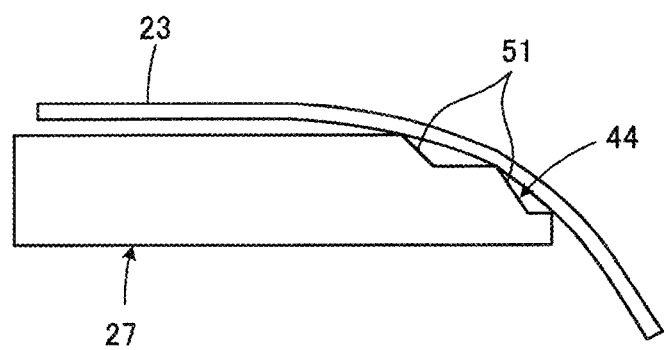
FIG. 11 illustrates another modification to the edge portion of the terminal electrode and corresponds to FIG. 8A.

As illustrated in, for example, FIG. 11, the edge portion 44 may be chamfered to form two recessed surfaces 51 each having a V-shape in section as another modification to the chamfered portion. According to this modification, the number of the points of contact with the wire 23 can be larger than that in the case of the modification illustrated in FIG. 10, and damage to the wire 23 can be further decreased. The number of the points of contact with the wire 23 can be further increased in accordance with the number of the recessed surfaces each having a V-shape in section. Thus, the edge portion 44 is preferably in contact with the wire 23 at multiple points. In this case, the region of the edge portion 44 that is interposed between the multiple points preferably has a recessed surface.

There can be many other modifications to the shape of the chamfered portion. For example, the shape can be changed into a shape in which a V-shaped bent portion of the recessed surface having a V-shape in section has a curved surface, a shape in which the bottom surface of the chamfered portion is not parallel to a main surface of the metallic plate forming the terminal electrode, or another shape. The shape may be changed into, for example, a shape of a convex rounded surface such that the contact area between the wire and the metallic plate forming the terminal electrode is increased.

The chamfer shape can be readily changed in a manner in which the shape of a mold corresponding to the coining mold 46 illustrated in FIG. 9B is changed. However, the chamfering method is not limited to the above additional coining process, provided that the same structure can be obtained.

Figure 2B:
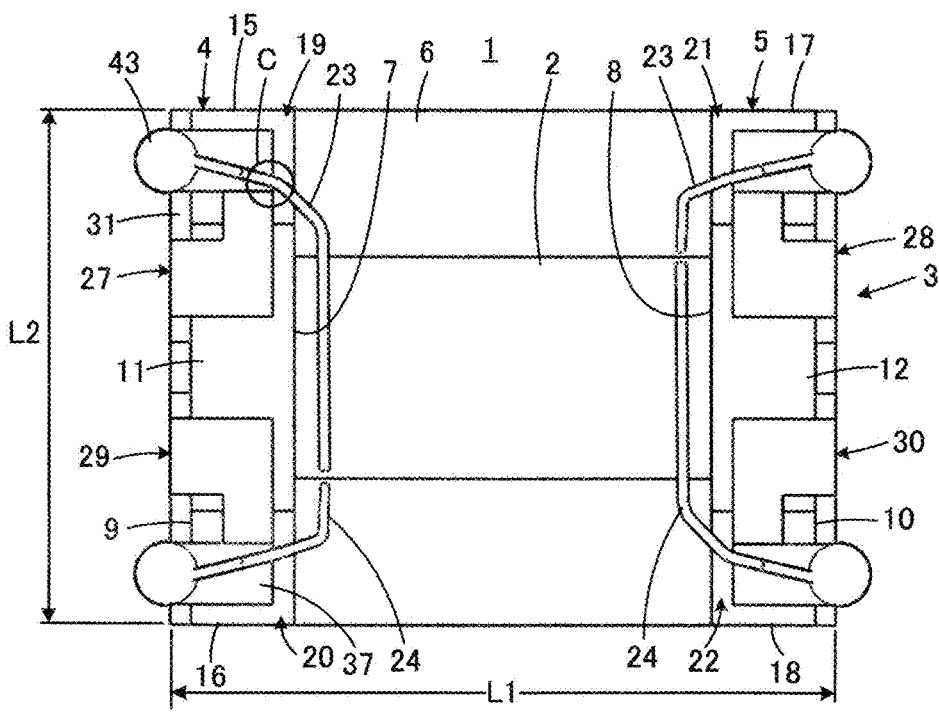
FIG. 2B is a bottom view of the common-mode choke coil.
Figure 2C:
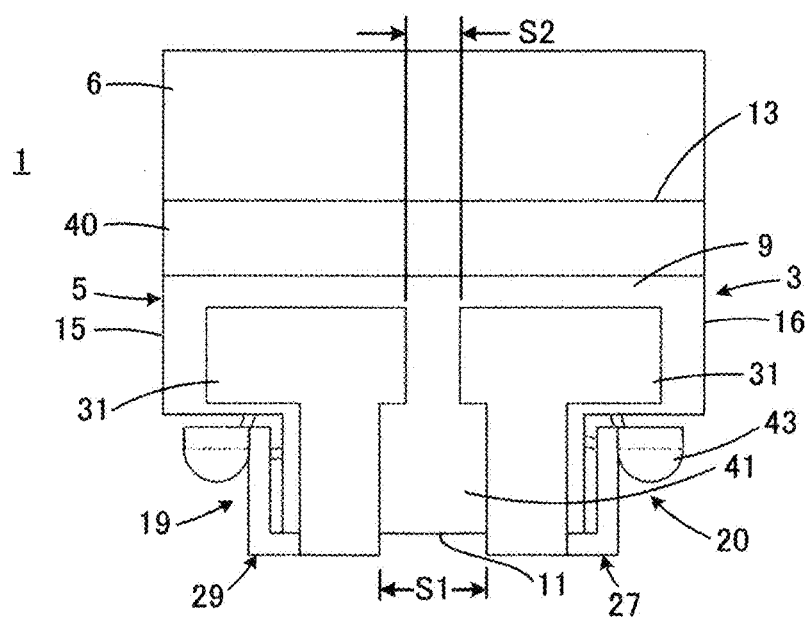
FIG. 2C is a left-side view of the common-mode choke coil.
Figure 3:
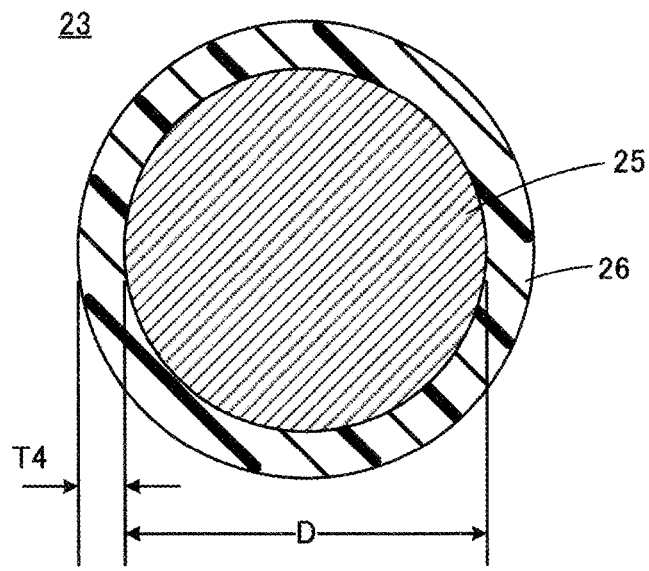
FIG. 3 is an enlarged sectional view of a wire that the common-mode choke coil illustrated in FIGS. 1A and 1B includes.

The place C surrounded by the circle in FIG. 2B is described as an example of the edge portion 44 of the terminal electrode 27 in contact with the wire 23. However, the same contact state can be found from other places related to paths on which the wires 23 and 24 are pulled. It is not necessary to chamfer a portion of the terminal electrode 27 that is not in contact with the wire 23. It is preferable that the wire 23 is not in contact with the flange portion 4 from the winding core portion 2 to the terminal electrode 27.

Regarding the external dimensions of the ferrite core 3, as illustrated in FIG. 2B, it is preferable that an external dimension L1 that is measured in the axial direction of the winding core portion 2 be 3.4 mm or less, and an external dimension L2 that is measured in a direction perpendicular to the axial direction of the winding core portion 2 be 2.7 mm or less in order to miniaturize the common-mode choke coil 1. With this configuration, the miniaturization of the common-mode choke coil 1 enables the common-mode choke coil 1 to be located nearer a low EMC component and improves a substantial effect of inhibiting a noise. In the case where the volume of the ferrite core 3 is a predetermined volume or less, the absolute amount of expansion and shrinkage of the ferrite core 3 due to heating and cooling can be decreased, and a variation in the characteristics at between a low temperature and a high temperature can be decreased.

As illustrated in FIG. 2A, the thicknesses T1 and T2 of the first and second flange portions that are measured in the axial direction of the winding core portion 2 are preferably less than 0.7 mm With this configuration, the length of the winding core portion 2 in the axial direction can be increased within the limited range of the external dimensions L1 and L2 of the common-mode choke coil 1. This means that the degree of freedom of the way in which the wires 23 and 24 are wound is increased. For this reason, the number of turns of the wires 23 and 24 can be increased, and consequently, the inductance value can be increased, or the thickness of the wires 23 and 24 to be wound can be increased, consequently, disconnection of the wires 23 and 24 is unlikely to occur, and the direct current resistance of the wires 23 and 24 can be decreased. An increase in the clearance between the wires (thickness of the insulating coating) decreases the line capacitance.

In a state where the common-mode choke coil 1 is mounted on the mounting surface, the area of each of the first and second flange portions 4 and 5 that is projected on the mounting surface, that is, the area of each of the flange portions 4 and 5 illustrated in FIG. 2B is preferably less than 1.75 mm$^2$. With this configuration, the length of the winding core portion 2 in the axial direction can be increased within the limited range of the external dimensions L1 and L2 of the common-mode choke coil 1 as in the above case, and accordingly, the same effects as in the above case can be expected.

The sectional area of the winding core portion 2 is preferably less than 1.0 mm$^2$. With this configuration, the total length of the wires 23 and 24 can be decreased while the number of turns of the wires 23 and 24 is maintained, and accordingly, the Sdd11 characteristics can be improved.

In a state where the common-mode choke coil 1 is mounted on the mounting surface, the distance between the winding core portion 2 and the mounting surface, that is, a distance L3 illustrated in FIG. 2A is preferably 0.5 mm or more. With this configuration, the distance between a ground pattern that can be formed on the mounting surface side and each of the wires 23 and 24 wound around the winding core portion 2 can be increased, a stray capacitance between the ground pattern and each of the wires 23 and 24 can be decreased, and accordingly, mode conversion characteristics can be improved.

As illustrated in FIG. 2A, the thickness T3 of the ferrite plate 6 is preferably 0.75 mm or less. With this configuration, the total height of the common-mode choke coil 1 can be decreased, or the height position of the winding core portion 2 can be a higher position away from the mounting surface without increasing the total height of the common-mode choke coil 1. Consequently, the stray capacitance between the ground pattern on the mounting surface side and each of the wires 23 and 24 can be decreased, and accordingly, the mode conversion characteristics can be improved.

The clearance between each of the first and second flange portions 4 and 5 and the ferrite plate 6 is preferably 10 µm or less. With this configuration, the magnetic resistance of the magnetic circuit formed by the ferrite core 3 and the ferrite plate 6 can be decreased, and accordingly, the inductance value can be increased. The clearance between each of the first and second flange portions 4 and 5 and the ferrite plate 6 can be obtained, for example, in a manner in which a sample of the common-mode choke coil 1 is polished such that an end surface of one of the flange portions 4 and 5 becomes flat, the clearance of the sample is measured in the width direction (direction of L2 in FIG. 2B) at five points that are at regular intervals, and the arithmetic mean of the measured values is calculated.

The common-mode choke coil 1 described above is characterized in that the common-mode inductance value at 150° C. and 100 kHz is 160 µH or more, and the return loss at 20° C. and 10 MHz is −27.1 dB or less. In the case where the common-mode inductance value is 160 µH or more, a common-mode rejection ratio of −45 dB or less, which is noise removal performance required for high speed communication such as BroadR-Reach, can be satisfied. The common-mode choke coil 1 have improved bandpass characteristics of communication signals during the high speed communication and ensures the quality of the communication. In particular, a return loss of −27 dB or less enables the communication to be performed without problems. Moreover, a return loss of −27.1 dB or less enables high speed communication with higher quality to be achieved. Accordingly, the common-mode choke coil 1 enables at least high speed communication to be performed at a higher temperature and achieves high speed communication with higher quality at a normal temperature.

In the common-mode choke coil 1, the return loss at 130° C. and 10 MHz is preferably −27 dB or less. With this configuration, the common-mode choke coil 1 can achieve the communication in a wider temperature range without problems.

An example of the common-mode choke coil 1 is a common-mode choke coil manufactured to have the following configuration:
 a relative permeability of the ferrite core 3 of 1000,
 external Dimensions L1×L2 of the ferrite core 3 of 3.2 mm×2.5 mm,
 a thickness T3 of the ferrite plate 6 of 0.7 mm, and
 a clearance between the ferrite plate 6 and each of the flange portions 4 and 5 of 5 µm.

Figure 12:
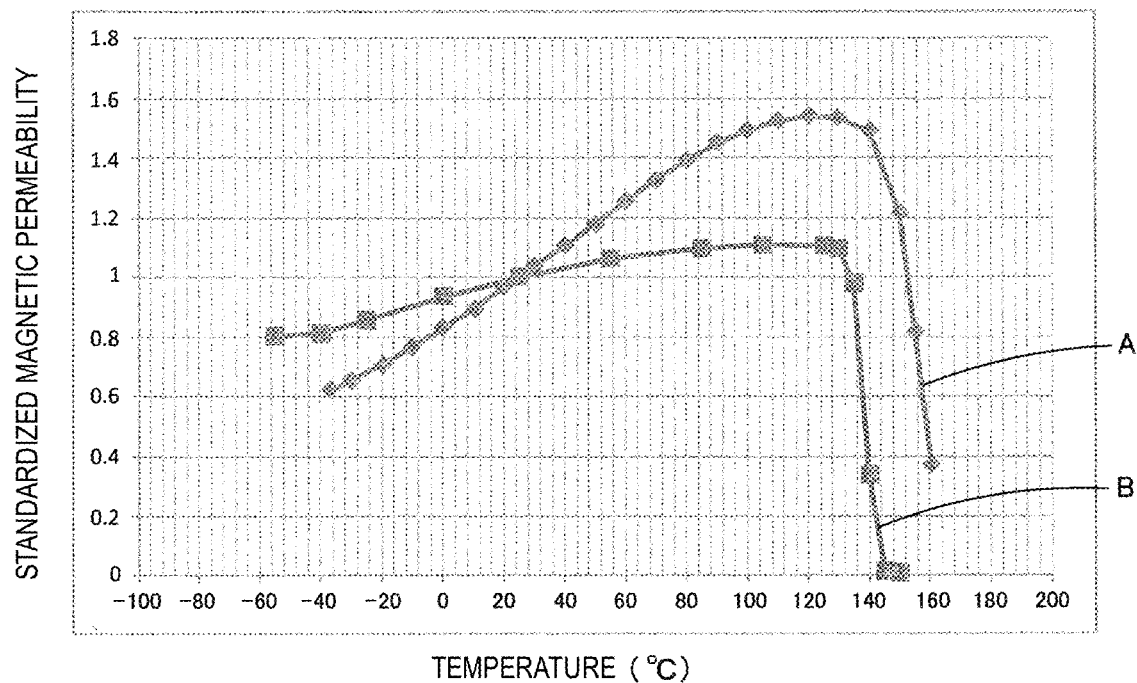
FIG. 12 illustrates a comparison between temperature characteristics of magnetic permeability of a ferrite core included in the common-mode choke coil according to the embodiment and the temperature characteristics of magnetic permeability of a ferrite core included in a common-mode choke coil according to a comparative example.

FIG. 12 illustrates a comparison between temperature characteristics (A) of the magnetic permeability of the ferrite core 3 included in the common-mode choke coil 1 according to the embodiment and temperature characteristics (B) of the magnetic permeability of a ferrite core included in a common-mode choke coil according to a comparative example. The ferrite core included in the common-mode choke coil according to the comparative example has a relative permeability of 1700. The other configurations of the common-mode choke coil according to the comparative example are the same as in the common-mode choke coil 1 according to the embodiment. In FIG. 12, "standardized magnetic permeability" on the vertical axis represents a relative value when the magnetic permeability at 25° C. is regarded as 1. In FIG. 12, a "temperature" on the horizontal direction represents a so-called ambient temperature, specifically, the temperature of a thermostatic chamber that is displayed when the common-mode choke coil according to the embodiment (A) and the common-mode choke coil according to the comparative example (B) are put in the thermostatic chamber.

As illustrated in FIG. 12, in the case of the embodiment (A), the standard magnetic permeability at 150° C. is more than 1. In contrast, in the case of the comparative example (B), at about 140° C., which is more than the Curie temperature, the standard magnetic permeability is less than 1.

Figure 13:
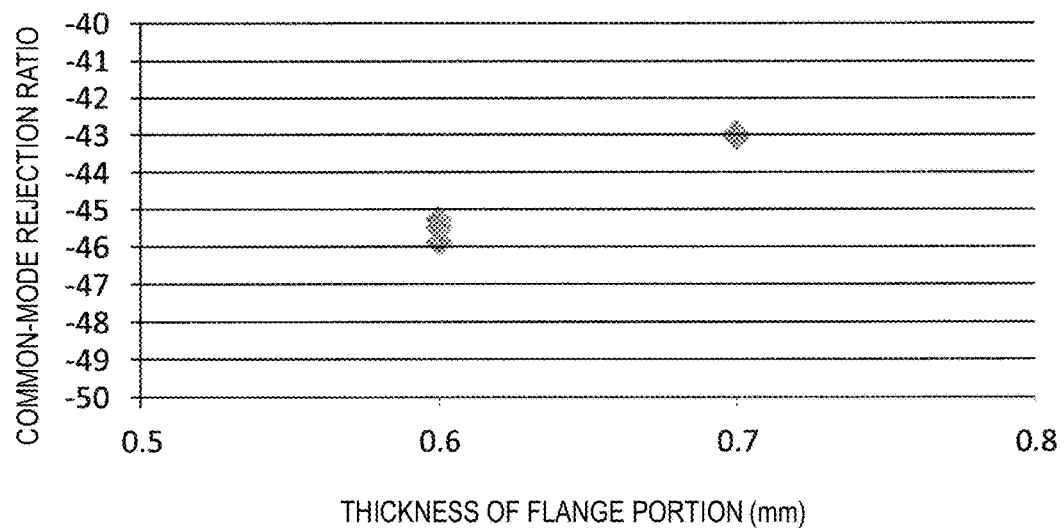
FIG. 13 illustrates the relationship between the thickness of a flange portion and a common-mode rejection ratio in the common-mode choke coil according to the embodiment.

FIG. 13 illustrates the relationship between the thicknesses T1 and T2 of the flange portions 4 and 5 and the common-mode rejection ratio at 20° C. in the common-mode choke coil 1 according to the embodiment. The common-mode rejection ratio represents a common-mode noise removal performance, which is an alternative characteristic of the inductance value. The larger a minus value of the common-mode rejection ratio, the larger the inductance value.

As illustrated in FIG. 13, when the thicknesses T1 and T2 of the flange portions 4 and 5 are 0.6 mm, the common-mode rejection ratio can be −45 dB or less. In the case of the embodiment (A), as illustrated in FIG. 12, since the standard magnetic permeability at 150° C. is more than 1, it can be understood that the common-mode rejection ratio can be −45 dB or less at 150° C. Accordingly, it can be understood that the common-mode choke coil 1 according to the embodiment enables at least high speed communication to be performed at a higher temperature. At this time, the common-mode inductance value is 160 μH or more. In contrast, in the case of the comparative example (B), as illustrated in FIG. 12, the magnetic permeability of the ferrite core at 150° C. is substantially zero, and the common-mode rejection ratio cannot be maintained at −45 dB or less.

Figure 14:
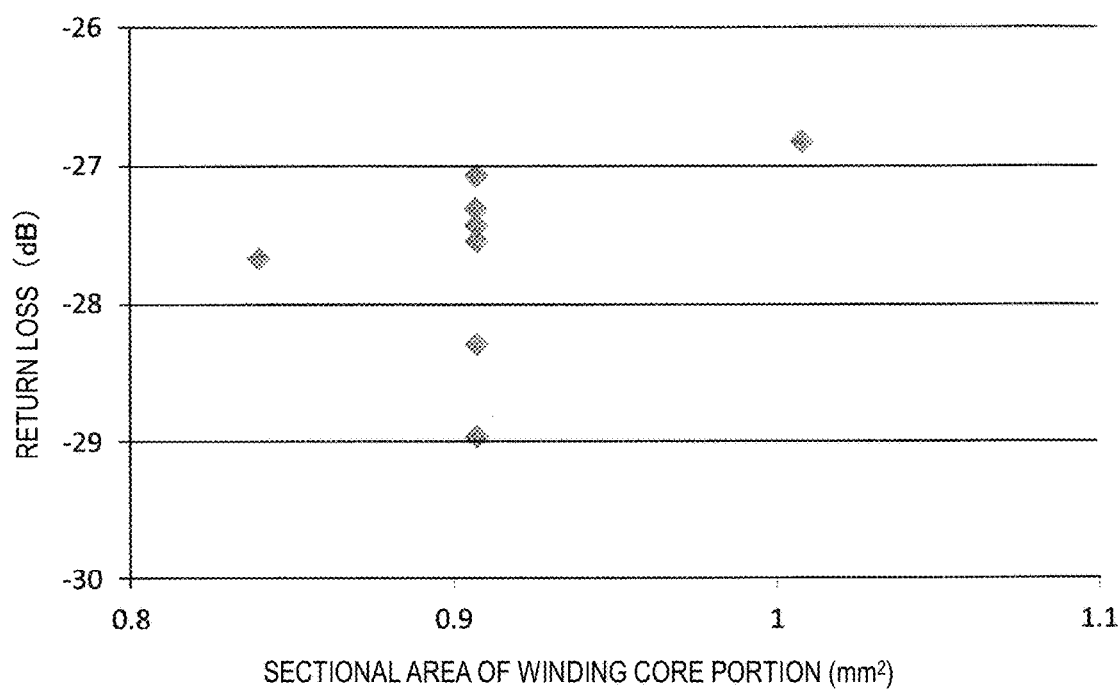
FIG. 14 illustrates the relationship between a sectional area of a winding core portion and a return loss in the common-mode choke coil according to the embodiment.

FIG. 14 illustrates the relationship between a sectional area of the winding core portion 2 and the return loss at 20° C. in the common-mode choke coil 1 according to the embodiment. As illustrated in FIG. 14, when the sectional area of the winding core portion 2 is 0.92 mm or less, the return loss can be −27.1 dB or less. Accordingly, it can be understood that the common-mode choke coil 1 according to the embodiment achieves high speed communication with higher quality.

Figure 15:
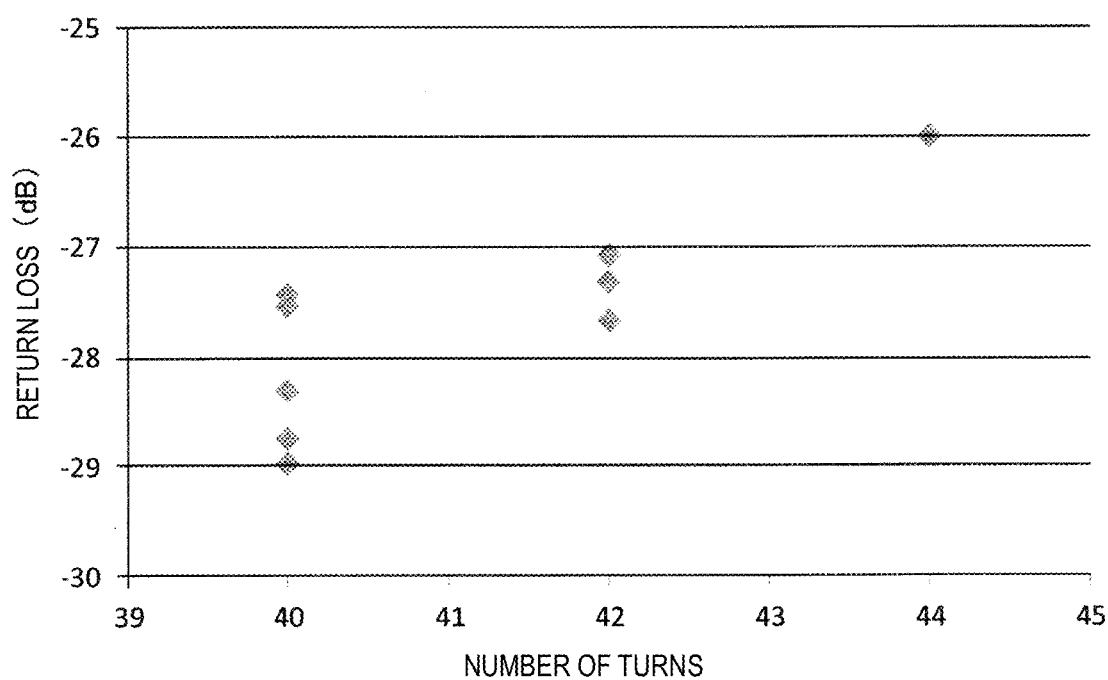
FIG. 15 illustrates the relationship between the number of turns of the wires and the return loss in the common-mode choke coil according to the embodiment.

FIG. 15 illustrates the relationship between the number of turns of the wires 23 and 24 and the return loss at 20° C. in the common-mode choke coil 1 according to the embodiment. As illustrated in FIG. 15, when the number of turns of the wires 23 and 24 is 42 turns or less, the return loss can be −27.1 dB or less. Accordingly, it can be understood that the common-mode choke coil 1 according to the embodiment achieves high speed communication with higher quality.

The common-mode choke coil according to the disclosure is described above on the basis of the more specific embodiment. The embodiment is described by way of example, and other various modifications can be made.

For example, as well illustrated in FIGS. 14 and 15, there are one or more configurations that enable the return loss at 20° C. and 10 MHz to be −27.1 dB or less. A configuration that enables the common-mode inductance value at 150° C. and 100 kHz to be 160 μH or more and enables the return loss at 20° C. and 10 MHz to be −27.1 dB or less is not limited to the configurations described according to the embodiment. The configuration can be appropriately changed with reference to the disclosure and by using technical knowledge of a person skilled in the art.

That is, the disclosure mainly demonstrates not only that a specific configuration achieves specific characteristics but also that the common-mode choke coil achieves a solution that has not been assumed in a manner in which a feasible range of high speed communication at a high temperature and a low temperature is selected.

While some embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A common-mode choke coil comprising:
   a ferrite core including a winding core portion and first and second flange portions that are respectively disposed on first and second end portions of the winding core portion that are opposite each other;
   first and second wires, each of which is helically wound around the winding core portion and includes a linear central conductor and an insulating coating layer that covers a circumferential surface of the central conductor;
   first and second terminal electrodes to which a first end of the first wire and a second end of the first wire, that is opposite the first end, are electrically connected, respectively; and
   third and fourth terminal electrodes to which a first end of the second wire and a second end of the second wire, that is opposite the first end, are electrically connected, respectively, and
   a common-mode inductance value at 150° C. and 100 kHz is 160 μH or more, and a return loss at 20° C. and 10 MHz is −27.1 dB or less.

2. The common-mode choke coil according to claim 1, wherein the return loss at 130° C. and 10 MHz is −27 dB or less.

3. The common-mode choke coil according to claim 1, wherein a Curie temperature of the ferrite core is 150° C. or more.

4. The common-mode choke coil according to claim 1, wherein a relative permeability of the ferrite core is 1500 or less.

5. The common-mode choke coil according to claim 1, wherein an external dimension of the ferrite core that is measured in an axial direction of the winding core portion is 3.4 mm or less, and an external dimension of the ferrite core that is measured in a direction perpendicular to the axial direction of the winding core portion is 2.7 mm or less.

6. The common-mode choke coil according to claim 5, wherein a thickness of each of the first and second flange portions that is measured in the axial direction of the winding core portion is less than 0.7 mm.

7. The common-mode choke coil according to claim 5, wherein an area of each of the first and second flange portions that is projected on a mounting surface is less than 1.75 mm$^2$ in a state where the common-mode choke coil is mounted on the mounting surface.

8. The common-mode choke coil according to claim 5, wherein a sectional area of the winding core portion is less than 1.0 mm$^2$.

9. The common-mode choke coil according to claim 5, wherein a distance between the winding core portion and a mounting surface is 0.5 mm or more in a state where the common-mode choke coil is mounted on the mounting surface.

10. The common-mode choke coil according to claim 1, wherein the number of turns of each of the first and second wires wound around the winding core portion is 42 turns or less.

11. The common-mode choke coil according to claim 1, further comprising:
    a ferrite plate that extends over the first and second flange portions,
    wherein a thickness of the ferrite plate is 0.75 mm or less.

12. The common-mode choke coil according to claim 11, wherein a clearance between the first and second flange portions and the ferrite plate is 10 μm or less.

13. The common-mode choke coil according to claim 1, wherein a diameter of the central conductor of each wire is 35 μm or less.

14. The common-mode choke coil according to claim 1, wherein a diameter of the central conductor of each wire is 28 μm or more.

15. The common-mode choke coil according to claim 1, wherein a thickness of the insulating coating layer of each wire is 6 μm or less.

16. The common-mode choke coil according to claim 1, wherein a thickness of the insulating coating layer of each wire is 3 µm or more.

17. The common-mode choke coil according to claim 1, wherein the insulating coating layer of each wire is formed of a resin containing at least an imide linkage.

18. The common-mode choke coil according to claim 2, wherein a Curie temperature of the ferrite core is 150° C. or more.

19. The common-mode choke coil according to claim 2, wherein a relative permeability of the ferrite core is 1500 or less.

20. The common-mode choke coil according to claim 2, wherein an external dimension of the ferrite core that is measured in an axial direction of the winding core portion is 3.4 mm or less, and an external dimension of the ferrite core that is measured in a direction perpendicular to the axial direction of the winding core portion is 2.7 mm or less.

* * * * *